United States Patent
Jheng et al.

(10) Patent No.: US 11,310,916 B1
(45) Date of Patent: Apr. 19, 2022

(54) METAL CIRCUIT ON POLYMER COMPOSITE SUBSTRATE SURFACE AND METHOD FOR MANUFACTURING THE SAME

(71) Applicant: AMULAIRE THERMAL TECHNOLOGY, INC., New Taipei (TW)

(72) Inventors: Jhao-Siang Jheng, New Taipei (TW); Chun-Lung Wu, New Taipei (TW)

(73) Assignee: AMULAIRE THERMAL TECHNOLOGY, INC., New Taipei (TW)

( * ) Notice: Subject to any disclaimer, the term of this patent is extended or adjusted under 35 U.S.C. 154(b) by 0 days.

(21) Appl. No.: 17/133,597

(22) Filed: Dec. 23, 2020

(51) Int. Cl.
| | |
|---|---|
| *H05K 1/09* | (2006.01) |
| *H05K 3/06* | (2006.01) |
| *H05K 3/18* | (2006.01) |
| *H01L 21/302* | (2006.01) |
| *H01L 23/52* | (2006.01) |
| *H01L 23/528* | (2006.01) |
| *H05K 3/00* | (2006.01) |
| *H05K 1/05* | (2006.01) |

(52) U.S. Cl.
CPC ........... *H05K 3/0044* (2013.01); *H05K 1/056* (2013.01)

(58) Field of Classification Search
CPC ........ H05K 1/09; H05K 1/056; H05K 1/0306; H05K 3/06; H05K 3/18; H05K 3/002; H05K 3/383; H05K 3/388; H05K 3/0044; H05K 3/1463; H05K 3/4038; H01L 21/302; H01L 21/3212; H01L 21/7684; H01L 23/52; H01L 23/528; H01L 23/544
USPC .......... 174/258; 438/401, 693; 257/E21.244, 257/E21.304, E23.151, E23.179
See application file for complete search history.

(56) References Cited

U.S. PATENT DOCUMENTS

| | | | | |
|---|---|---|---|---|
| 5,943,588 | A | * 8/1999 | Watrobski | H01L 23/544 257/E23.179 |
| 10,893,613 | B2 | * 1/2021 | Kim | H05K 3/381 |
| 2008/0171441 | A1 | * 7/2008 | Takemiya | H01L 21/7684 257/E21.244 |

FOREIGN PATENT DOCUMENTS

| | | |
|---|---|---|
| TW | 200621895 A | 7/2006 |
| TW | M607559 U | 2/2021 |

* cited by examiner

*Primary Examiner* — Xiaoliang Chen
(74) *Attorney, Agent, or Firm* — Li & Cai Intellectual Property Office

(57) ABSTRACT

A metal circuit on a polymer composite substrate surface and a method for manufacturing the same are provided. The metal circuit on the polymer composite substrate surface includes a polymer composite layer and a metal circuit layer. The metal circuit layer is formed from a metal piece molded by metal processing, and is integrated onto a surface of the polymer composite layer. The metal circuit layer has one or a plurality of circuit grooves formed therein, the polymer composite layer has one or a plurality of bulges formed therein, and the bulge is deformed and bulged at the corresponding circuit groove.

10 Claims, 5 Drawing Sheets

METAL CIRCUIT ON POLYMER COMPOSITE SUBSTRATE SURFACE AND METHOD FOR MANUFACTURING THE SAME

FIELD OF THE DISCLOSURE

The present disclosure relates to a metal circuit and a method for manufacturing the same, and more particularly to a metal circuit on a polymer composite substrate surface and a method for manufacturing the same.

BACKGROUND OF THE DISCLOSURE

Processing of a metal circuit is conventionally completed by a photolithography-etching technique or a CNC (computer numerical control) engraving technique. In a photolithography-etching process, a precision of a printed circuit is usually decreased when relative positions of circuit lines are affected by screen tension and the number of printings. The CNC engraving technique is capable of achieving a higher precision, but is not suitable for mass production.

SUMMARY OF THE DISCLOSURE

In response to the above-referenced technical inadequacies, the present disclosure provides a metal circuit on a polymer composite substrate surface and a method for manufacturing the same.

In one aspect, the present disclosure provides a metal circuit on a polymer composite substrate surface, and the metal circuit includes a polymer composite layer and a metal circuit layer. The metal circuit layer is formed from a metal piece molded by metal processing, and is integrated onto a surface of the polymer composite layer. The metal circuit layer has one or a plurality of circuit grooves formed therein, the polymer composite layer has one or a plurality of bulges formed therein, and the bulge is deformed and bulged at the corresponding circuit groove.

In an exemplary embodiment, the polymer composite layer is one of an epoxy-based layer, a polyimide-based layer, and a polypropylene-based layer.

In an exemplary embodiment, the polymer composite layer includes a filler, and the filler is selected from at least one of aluminum oxide, aluminum nitride, silicon nitride, silicon carbide, and boron nitride.

In an exemplary embodiment, the metal circuit layer is formed by processing a stamped metal piece.

In an exemplary embodiment, the metal circuit layer is formed by processing a forged metal piece.

In an exemplary embodiment, a bulging height of the bulge is configured to be between 0.01 mm and 3 mm.

In another aspect, the present disclosure provides a method for manufacturing a metal circuit on a polymer composite substrate surface. The method includes: (a) preforming a metal piece that has one or a plurality of circuit channels by metal processing; (b) integrating the metal piece onto a surface of a polymer composite layer, so that the surface of the polymer composite layer is deformed and bulged to have one or a plurality of bulges at the one or plurality of circuit channels correspondingly; and (c) removing a part of the metal piece, so that one or a plurality of circuit grooves is exposed to form a metal circuit layer having a patterned circuit, and the bulge is deformed and bulged at the corresponding circuit groove.

In an exemplary embodiment, the metal piece is a stamped metal piece having the plurality of circuit channels, and is preformed by a stamping process.

In an exemplary embodiment, the metal piece is a forged metal piece having the plurality of circuit channels, and is preformed by a forging process. In an exemplary embodiment, the part of the metal piece is removed by milling, planing or cutting.

Therefore, in the metal circuit on the polymer composite substrate surface provided by the present disclosure, the metal circuit layer is formed from a metal piece molded by metal processing, and is integrated onto the surface of the polymer composite layer. The metal circuit layer has the one or plurality of circuit grooves formed therein, the polymer composite layer has the one or plurality of bulges formed therein, and the bulge is deformed and bulged at the corresponding circuit groove. Accordingly, a circuit having a high precision can be obtained, and is suitable for mass production. At the same time, an improved insulating effect between circuit lines can also be achieved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
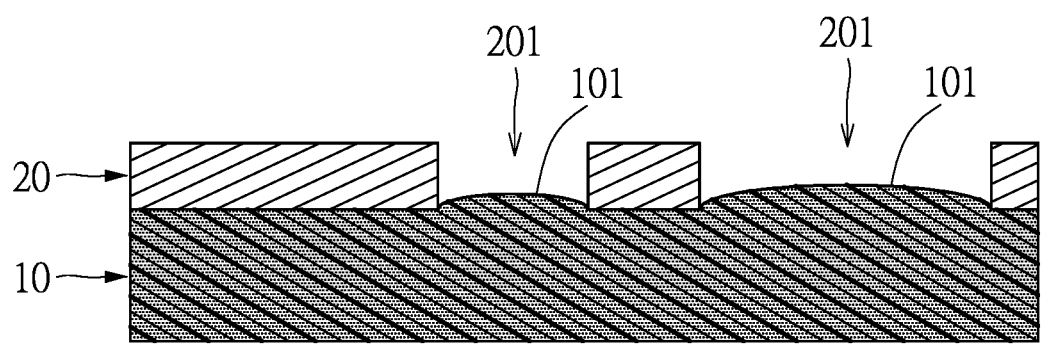
FIG. 1 is a side view of a metal circuit on a polymer composite substrate surface according to an embodiment of the present disclosure.
Figure 2:
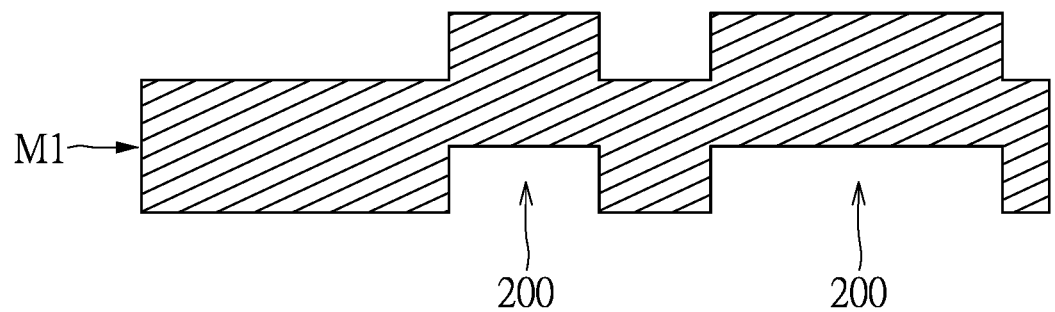
FIG. 2 to FIG. 5 are schematic views showing a manufacturing process of the metal circuit on the polymer composite substrate surface according to the embodiment of the present disclosure.
Figure 3:
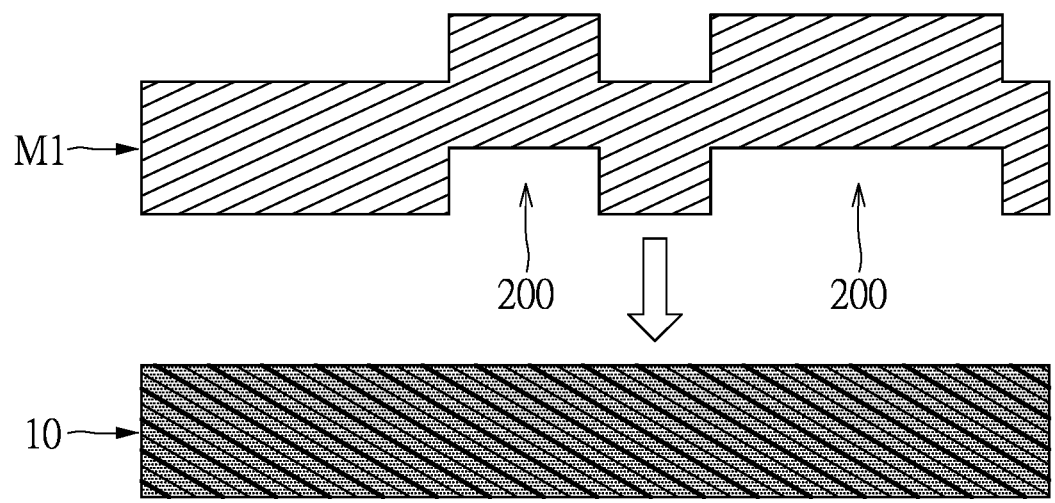
Figure 4:
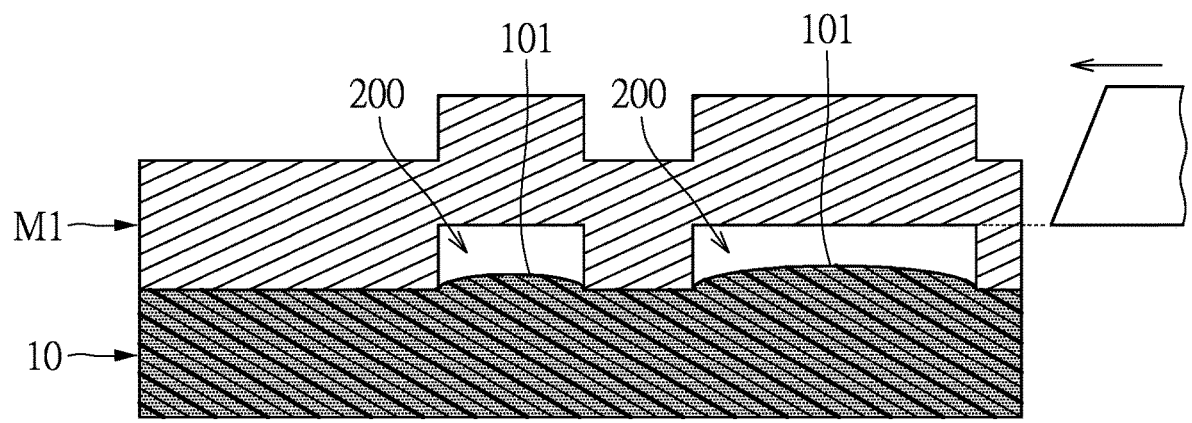
Figure 5:
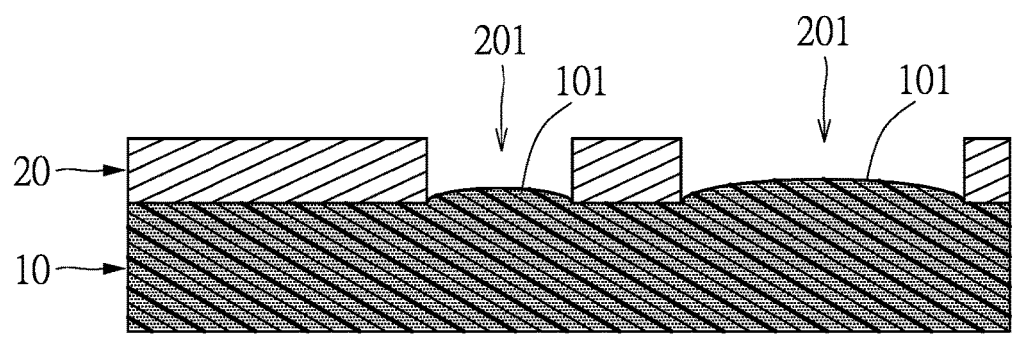
Figure 6:
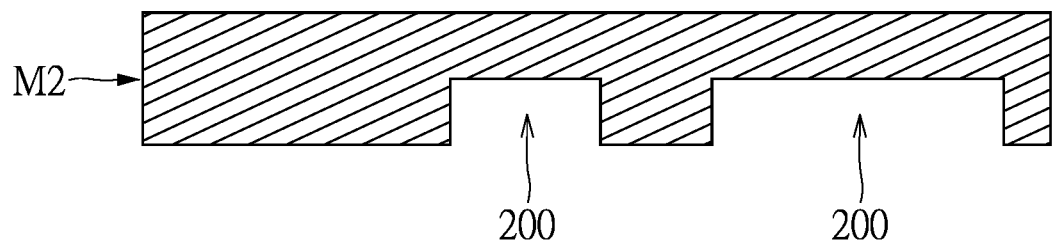
FIG. 6 to FIG. 9 are schematic views showing a manufacturing process of a metal circuit on a polymer composite substrate surface according to another embodiment of the present disclosure.
Figure 7:
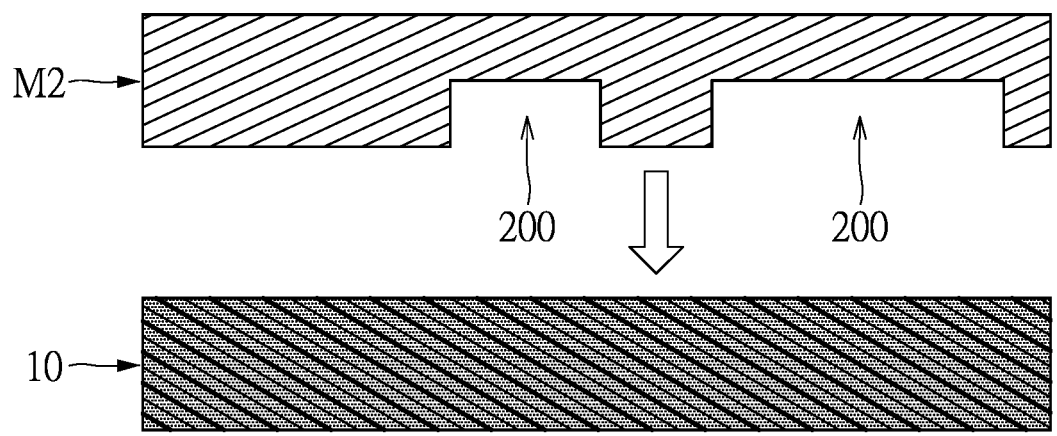
Figure 8:
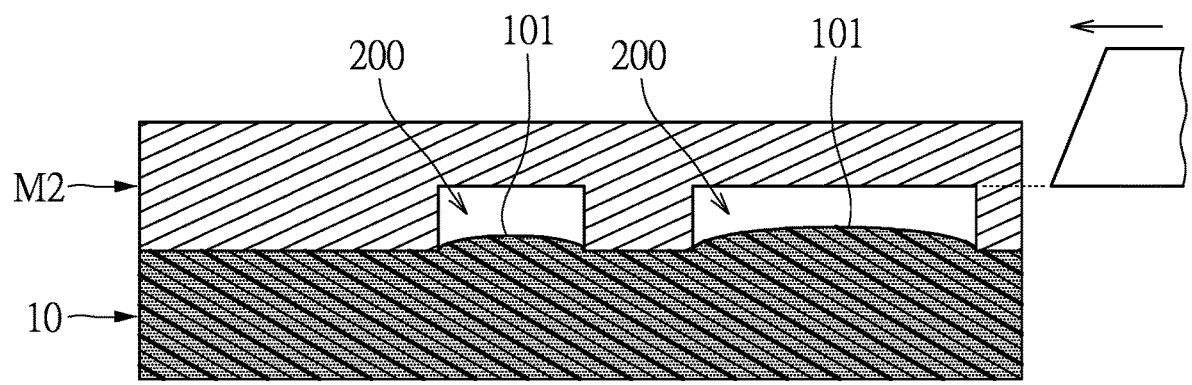
Figure 9:
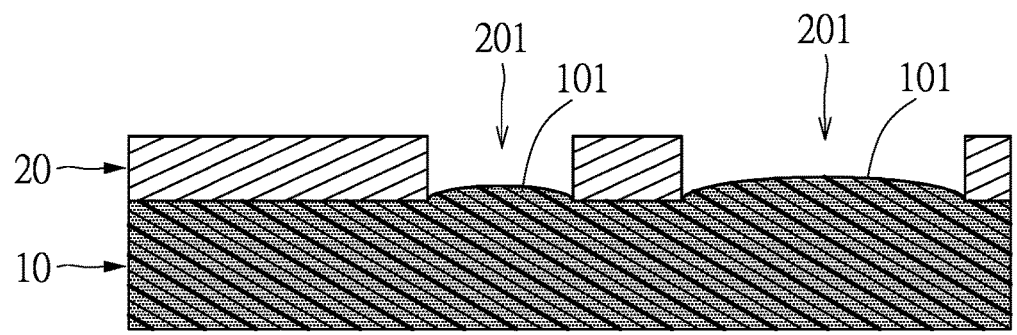

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1, an embodiment of the present disclosure provides a metal circuit on a polymer composite substrate surface. As shown in FIG. 1, the metal circuit on the polymer composite substrate surface provided in the embodiment of the present disclosure includes a polymer composite layer 10 and a metal circuit layer 20.

In the present embodiment, the polymer composite layer 10 is an epoxy-based layer. Further, the polymer composite layer 10 includes a filler, which is at least one of aluminum oxide, aluminum nitride, silicon nitride, silicon carbide, and boron nitride. In other embodiments, the polymer composite layer 10 can be a polyimide-based layer or a polypropylene-based layer.

The metal circuit layer 20 is formed on a surface of the polymer composite layer 10. In one embodiment, the metal circuit layer 20 is formed by processing a stamped metal piece having a plurality of circuit channels, and is preformed by using a stamping process. In another embodiment, the metal circuit layer 20 is formed by processing a forged metal piece having a plurality of circuit channels, and is preformed by using a forging process. Accordingly, a circuit having a high precision can be obtained, and is suitable for mass production.

Specifically, the metal circuit layer 20 is formed from the stamped metal piece or the forged metal piece being integrated onto the surface of the polymer composite layer 10 through hot pressing. In this way, the time and cost for processing can be significantly reduced. Furthermore, the metal circuit layer 20 has one or a plurality of circuit grooves 201 formed therein, the polymer composite layer 10 has one or a plurality of bulges 101 formed therein, and the bulge 101 is deformed and bulged at the corresponding circuit groove 201.

More specifically, the polymer composite layer 10 having elastic and insulating properties is used as a base. After being hot pressed, the polymer composite layer 10 is deformed and bulged to have the bulge 101 at the circuit groove 201. In this way, not only can the metal circuit layer 20 be integrated onto the surface of the polymer composite layer 10, but an improved insulating effect between circuit lines can also be achieved at the same time.

To further improve insulation of the circuit lines, a bulging height of the bulge 101 in the present embodiment is configured to be between 0.01 mm and 3 mm Under this configuration, an insulating effect between the circuit lines can be further improved.

Reference is made to FIG. 2 to FIG. 5, which show a method for manufacturing a metal circuit on a polymer composite substrate surface according to the embodiment of the present disclosure. The method mainly includes the following steps.

(a) Preforming a metal piece M1 that has one or a plurality of circuit channels 200 by metal processing. In the present embodiment, the metal piece M1 is a metal piece having the one or plurality of circuit channels 200, and is preformed by using a stamping process. Therefore, the metal piece M1 of the present embodiment is a stamped metal piece.

(b) Integrating the metal piece M1 onto a surface of a polymer composite layer 10, so that the surface of the polymer composite layer 10 is deformed and bulged to have one or a plurality of bulges 101 at the one or plurality of circuit channels 200 correspondingly.

(c) Removing a part of the metal piece M1, so that one or a plurality of circuit grooves 201 is exposed to form a metal circuit layer 20 having a patterned circuit. The bulge 101 is deformed and bulged at the corresponding circuit groove 201, so as to improve an insulating effect between circuit lines. In the present embodiment, any processing process can be utilized to remove the part of the metal piece M1. For example, the part of the metal piece M1 can be removed by milling, planing or cutting of a large area.

Reference is made to FIG. 6 to FIG. 9, which show a method for manufacturing a metal circuit on a polymer composite substrate surface according to another embodiment of the present disclosure. The method mainly includes the following steps.

(a) Preforming a metal piece M2 that has one or a plurality of circuit channels 200 by metal processing. In the present embodiment, the metal piece M2 is a metal piece having the one or plurality of circuit channels 200, and is preformed by using a forging process. Therefore, the metal piece M2 of the present embodiment is a forged metal piece.

(b) Integrating the metal piece M2 onto a surface of a polymer composite layer 10, so that the surface of the polymer composite layer 10 is deformed and bulged to have one or a plurality of bulges 101 at the one or plurality of circuit channels 200 correspondingly.

(c) Removing a part of the metal piece M2, so that one or a plurality of circuit grooves 201 is exposed to form a metal circuit layer 20 having a patterned circuit. The bulge 101 is deformed and bulged at the corresponding circuit groove 201, so as to improve an insulating effect between circuit lines. In the present embodiment, any processing process can be utilized to remove the part of the metal piece M2. For example, the part of the metal piece M2 can be removed by milling, planing or cutting of a large area.

In conclusion, in the metal circuit on the polymer composite substrate surface provided by the present disclosure, the metal circuit layer 20 is formed from a metal piece molded by metal processing, and is integrated onto the surface of the polymer composite layer 10. The metal circuit layer 20 has the one or plurality of circuit grooves 201 formed therein, the polymer composite layer 10 has the one or plurality of bulges 101 formed therein, and the bulge 101 is deformed and bulged at the corresponding circuit groove 201. Accordingly, a circuit having a high precision can be obtained, and is suitable for mass production. At the same time, an improved insulating effect between circuit lines can also be achieved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A metal circuit on a polymer composite substrate surface, comprising:
    a polymer composite layer; and
    a metal circuit layer being formed from a metal piece molded by metal processing, and being integrated onto a surface of the polymer composite layer, wherein the metal circuit layer has one or a plurality of circuit grooves formed therein, the polymer composite layer has one or a plurality of bulges formed therein, and the bulge is deformed and bulged at the corresponding circuit groove.

2. The metal circuit according to claim 1, wherein the polymer composite layer is one of an epoxy-based layer, a polyimide-based layer, and a polypropylene-based layer.

3. The metal circuit according to claim 2, wherein the polymer composite layer includes a filler, and the filler is selected from at least one of aluminum oxide, aluminum nitride, silicon nitride, silicon carbide, and boron nitride.

4. The metal circuit according to claim 1, wherein the metal circuit layer is formed by processing a stamped metal piece.

5. The metal circuit according to claim 1, wherein the metal circuit layer is formed by processing a forged metal piece.

6. The metal circuit according to claim 1, wherein a bulging height of the bulge is configured to be between 0.01 mm and 3 mm.

7. A method for manufacturing a metal circuit on a polymer composite substrate surface, the method comprising:
    (a) preforming a metal piece that has one or a plurality of circuit channels by metal processing;
    (b) integrating the metal piece onto a surface of a polymer composite layer, so that the surface of the polymer composite layer is deformed and bulged to have one or a plurality of bulges at the one or plurality of circuit channels correspondingly; and
    (c) removing a part of the metal piece, so that one or a plurality of circuit grooves is exposed to form a metal circuit layer having a patterned circuit, and the bulge is deformed and bulged at the corresponding circuit groove.

8. The method according to claim 7, wherein the metal piece is a stamped metal piece having the plurality of circuit channels, and is preformed by a stamping process.

9. The method according to claim 7, wherein the metal piece is a forged metal piece having the plurality of circuit channels, and is preformed by a forging process.

10. The method according to claim 7, wherein the part of the metal piece is removed by milling, planing or cutting.

* * * * *